US 8,551,887 B2
Oct. 8, 2013

(12) United States Patent
Shi

(54) METHOD FOR CHEMICAL MECHANICAL PLANARIZATION OF A COPPER-CONTAINING SUBSTRATE

(75) Inventor: Xiaobo Shi, Chandler, AZ (US)

(73) Assignee: Air Products and Chemicals, Inc., Allentown, PA (US)

( * ) Notice: Subject to any disclaimer, the term of this patent is extended or adjusted under 35 U.S.C. 154(b) by 298 days.

(21) Appl. No.: 12/964,943

(22) Filed: Dec. 10, 2010

(65) Prior Publication Data

US 2011/0312181 A1    Dec. 22, 2011

Related U.S. Application Data

(60) Provisional application No. 61/288,895, filed on Dec. 22, 2009.

(51) Int. Cl.
*H01L 21/302* (2006.01)

(52) U.S. Cl.
USPC .......... 438/693; 252/79.1; 252/79.2; 252/79.4

(58) Field of Classification Search
USPC ............................................. 252/79.1–79.4
See application file for complete search history.

(56) References Cited

U.S. PATENT DOCUMENTS

| | | | |
|---|---|---|---|
| 6,126,853 A | 10/2000 | Kaufman et al. | |
| 6,217,416 B1 | 4/2001 | Kaufman et al. | |
| 6,309,560 B1 | 10/2001 | Kaufman et al. | |
| 6,316,365 B1 | 11/2001 | Wang et al. | |
| 6,530,968 B2 * | 3/2003 | Tsuchiya et al. | 51/307 |
| 6,749,488 B2 | 6/2004 | Pasqualoni et al. | |
| 6,814,767 B2 | 11/2004 | Hirano | |
| 6,838,016 B2 | 1/2005 | Sakai et al. | |
| 6,936,543 B2 * | 8/2005 | Schroeder et al. | 438/692 |
| 6,953,389 B2 | 10/2005 | Lee et al. | |
| 7,265,055 B2 | 9/2007 | Thompson et al. | |
| 7,381,648 B2 | 6/2008 | Kaufman et al. | |
| 7,498,273 B2 | 3/2009 | Mallick et al. | |
| 7,736,405 B2 | 6/2010 | Darsillo et al. | |
| 2002/0043207 A1 | 4/2002 | Singer et al. | |
| 2002/0096659 A1 | 7/2002 | Sakai et al. | |
| 2002/0139055 A1 | 10/2002 | Asano et al. | |
| 2004/0194392 A1 | 10/2004 | Takemiya et al. | |
| 2006/0124593 A1 | 6/2006 | Moyaerts et al. | |
| 2007/0075292 A1 | 4/2007 | Mahulikar et al. | |
| 2007/0254964 A1 | 11/2007 | Mahulikar et al. | |
| 2008/0032505 A1 | 2/2008 | Kawamura et al. | |
| 2008/0064211 A1 | 3/2008 | Tsugita et al. | |
| 2008/0086950 A1 | 4/2008 | Kon et al. | |
| 2008/0104893 A1 | 5/2008 | Oh | |
| 2008/0120918 A1 | 5/2008 | Hattori et al. | |
| 2008/0121839 A1 | 5/2008 | Park et al. | |
| 2008/0171441 A1 | 7/2008 | Takemiya | |

FOREIGN PATENT DOCUMENTS

| | | |
|---|---|---|
| KR | 2003-36740 | 5/2003 |
| KR | 2006-13398 | 2/2006 |
| KR | 100854258 B1 | 8/2008 |
| TW | 200828437 A | 7/2008 |
| WO | 2004-101221 A2 | 11/2004 |

OTHER PUBLICATIONS

G.B. Shinn, et al, Chemical-Mechanical Polish, Handbook of Semiconductor Manufacturing Technology, 2000, 415-460, New York City.
D. Zeidler, et al, Characterization of Cu Chemical Mechanical Polishing by Electrochemical Investigations, Microelectronic Engineering, 1997, 259-265.
R.J. Gutmann, et al, Chemical-Mechanical Polishing of Copper with Oxide and Polymer Interlevel Dielectrics, Thin Solid Films, 1995, 596-600.

\* cited by examiner

*Primary Examiner* — Lan Vinh
*Assistant Examiner* — Maki Angadi
(74) *Attorney, Agent, or Firm* — Lina Yang

(57) ABSTRACT

A method using an associated composition for chemical mechanical planarization of a copper-containing substrate affords high copper removal rates and low dishing values during CMP processing of the copper-containing substrate, including an abrasive, at least three surfactants, preferably non-ionic and preferably three distinct surfactants, preferably in the range of 100 ppm to 2000 ppm per surfactant and an oxidizing agent.

17 Claims, No Drawings

METHOD FOR CHEMICAL MECHANICAL PLANARIZATION OF A COPPER-CONTAINING SUBSTRATE

CROSS REFERENCE TO RELATED APPLICATIONS

The present application claims the benefit of U.S. Provisional Patent Application Ser. No. 61/288,895 filed Dec. 22, 2009.

FIELD OF THE INVENTION

This invention relates to the chemical-mechanical planarization (CMP) of copper substrates on semiconductor wafers and slurry compositions therefor.

BACKGROUND OF THE INVENTION

The present invention relates to a copper CMP method and associated slurry composition that afford high removal rates of copper during CMP processing while also affording low dishing values.

Chemical mechanical planarization (chemical mechanical polishing, CMP) for planarization of semiconductor substrates is now widely known to those skilled in the art and has been described in numerous patents and open literature publications. An introductory reference on CMP is as follows: "Chemical-Mechanical Polish" by G. B. Shinn et al., Chapter 15, pages 415-460, in Handbook of Semiconductor Manufacturing Technology, editors: Y. Nishi and R. Doering, Marcel Dekker, New York City (2000).

In a typical CMP process, a substrate (e.g., a wafer) is placed in contact with a rotating polishing pad attached to a platen. A CMP slurry, typically an abrasive and chemically reactive mixture, is supplied to the pad during CMP processing of the substrate. During the CMP process, the pad (fixed to the platen) and substrate are rotated while a wafer carrier system or polishing head applies pressure (downward force) against the substrate. The slurry accomplishes the planarization (polishing) process by chemically and mechanically interacting with the substrate film being planarized due to the effect of the rotational movement of the pad relative to the substrate. Polishing is continued in this manner until the desired film on the substrate is removed with the usual objective being to effectively planarize the substrate. Typically metal CMP slurries contain an abrasive material, such as silica or alumina, suspended in an oxidizing, aqueous medium.

Silicon based semiconductor devices, such as integrated circuits (ICs), typically include a dielectric layer, which can be a low-k dielectric material, silicon dioxide, or other material. Multilevel circuit traces, typically formed from aluminum or an aluminum alloy or copper, are patterned onto the low-k or silicon dioxide substrate.

CMP processing is often employed to remove and planarize excess metal at different stages of semiconductor manufacturing. For example, one way to fabricate a multilevel copper interconnect or planar copper circuit traces on a silicon dioxide substrate is referred to as the damascene process. In a semiconductor manufacturing process typically used to form a multilevel copper interconnect, metallized copper lines or copper vias are formed by electrochemical metal deposition followed by copper CMP processing. In a typical process, the interlevel dielectric (ILD) surface is patterned by a conventional dry etch process to form vias and trenches for vertical and horizontal interconnects and make connection to the sublayer interconnect structures. The patterned ILD surface is coated with an adhesion-promoting layer such as titanium or tantalum and/or a diffusion barrier layer such as titanium nitride or tantalum nitride over the ILD surface and into the etched trenches and vias. The adhesion-promoting layer and/or the diffusion barrier layer is then overcoated with copper, for example, by a seed copper layer and followed by an electrochemically deposited copper layer. Electro-deposition is continued until the structures are filled with the deposited metal. Finally, CMP processing is used to remove the copper overlayer, adhesion-promoting layer, and/or diffusion barrier layer, until a planarized surface with exposed elevated portions of the dielectric (silicon dioxide and/or low-k) surface is obtained. The vias and trenches remain filled with electrically conductive copper forming the circuit interconnects.

When one-step copper CMP processing is desired, it is usually important that the removal rate of the metal and barrier layer material be significantly higher than the removal rate for dielectric material in order to avoid or minimize dishing of metal features or erosion of the dielectric. Alternatively, a multi-step copper CMP process may be employed involving the initial removal and planarization of the copper overburden, referred to as a step 1 copper CMP process, followed by a barrier layer CMP process. The barrier layer CMP process is frequently referred to as a barrier or step 2 copper CMP process. Previously, it was believed that the removal rate of the copper and the adhesion-promoting layer and/or the diffusion barrier layer must both greatly exceed the removal rate of dielectric so that polishing effectively stops when elevated portions of the dielectric are exposed. The ratio of the removal rate of copper to the removal rate of dielectric base is called the "selectivity" for removal of copper in relation to dielectric during CMP processing of substrates comprised of copper, tantalum and dielectric material. The ratio of the removal rate of tantalum to the removal rate of dielectric base is called the "selectivity" for removal of tantalum in relation to dielectric during CMP processing. When CMP slurries with high selectivity for removal of copper and tantalum in relation to dielectric are used, the copper layers are easily over-polished creating a depression or "dishing" effect in the copper vias and trenches. This feature distortion is unacceptable due to lithographic and other constraints in semiconductor manufacturing.

Another feature distortion that is unsuitable for semiconductor manufacturing is called "erosion." Erosion is the topography difference between a field of dielectric and a dense array of copper vias or trenches. In CMP, the materials in the dense array maybe removed or eroded at a faster rate than the surrounding field of dielectric. This causes a topography difference between the field of dielectric and the dense copper array.

A typically used CMP slurry has two actions, a chemical component and a mechanical component. An important consideration in slurry selection is "passive etch rate." The passive etch rate is the rate at which copper is dissolved by the chemical component alone and should be significantly lower than the removal rate when both the chemical component and the mechanical component are involved. A large passive etch rate leads to dishing of the copper trenches and copper vias, and thus, preferably, the passive etch rate is less than 10 nanometers per minute.

In relation to copper CMP, the current state of this technology involves use of a two-step process to achieve local and global planarization in the production of IC chips. During step 1 of a copper CMP process, the overburden copper is removed. Then step 2 of the copper CMP process follows to remove the barrier layer and achieve both local and global planarization. Generally, after removal of overburden copper in step 1, polished wafer surfaces have non-uniform local and global planarity due to differences in the step heights at various locations of the wafer surfaces. Low density features tend to have higher copper step heights whereas high density features tend to have low step heights. Due to differences in the step heights after step 1, step 2 copper CMP selective slurries with respect to tantalum to copper removal rates and copper to oxide removal rates are highly desirable. The ratio of the removal rate of tantalum to the removal rate of copper is called the "selectivity" for removal of tantalum in relation to copper during CMP processing of substrates comprised of copper, tantalum and dielectric material.

There are a number of theories as to the mechanism for chemical-mechanical polishing of copper. An article by D. Zeidler, Z. Stavreva, M. Ploetner, K. Drescher, "Characterization of Cu Chemical Mechanical Polishing by Electrochemical Investigations" (*Microelectronic Engineering*, 33(104), 259-265 (English) 1997), proposes that the chemical component forms a passivation layer on the copper changing the copper to a copper oxide. The copper oxide has different mechanical properties, such as density and hardness, than metallic copper and passivation changes the polishing rate of the abrasive portion. The above article by Gutmann, et al., entitled "Chemical-Mechanical Polishing of Copper with Oxide and Polymer Interlevel Dielectrics" (*Thin Solid Films*, 1995), discloses that the mechanical component abrades elevated portions of copper and the chemical component then dissolves the abraded material. The chemical component also passivates recessed copper areas minimizing dissolution of those portions.

These are two general types of layers that can be polished. The first layer is interlayer dielectrics (ILD), such as silicon oxide and silicon nitride. The second layer is metal layers such as tungsten, copper, aluminum, etc., which are used to connect the active devices.

In the case of CMP of metals, the chemical action is generally considered to take one of two forms. In the first mechanism, the chemicals in the solution react with the metal layer to continuously form an oxide layer on the surface of the metal. This generally requires the addition of an oxidizer to the solution such as hydrogen peroxide, ferric nitrate, etc. Then the mechanical abrasive action of the particles continuously and simultaneously removes this oxide layer. A judicious balance of these two processes obtains optimum results in terms of removal rate and polished surface quality.

In the second mechanism, no protective oxide layer is formed. Instead, the constituents in the solution chemically attack and dissolve the metal, while the mechanical action is largely one of mechanically enhancing the dissolution rate by such processes as continuously exposing more surface area to chemical attack, raising the local temperature (which increases the dissolution rate) by the friction between the particles and the metal and enhancing the diffusion of reactants and products to and away from the surface by mixing and by reducing the thickness of the boundary layer.

While prior art CMP systems are capable of removing a copper overlayer from a silicon dioxide substrate, the systems do not satisfy the rigorous demands of the semiconductor industry. These requirements can be summarized as follows. First, there is a need for high removal rates of copper to satisfy throughput demands. Secondly, there must be excellent topography uniformity across the substrate. Finally, the CMP method must minimize dishing and local erosion effects on polished substrates as well as minimizing defectivity levels to satisfy ever increasing lithographic demands.

There is a significant need for copper CMP process(es) and slurry(s) that afford low dishing and local erosion effects especially in view of the fact that the semiconductor industry continues to move towards smaller and smaller feature sizes. The present invention provides a solution to this significant need.

BRIEF SUMMARY OF THE INVENTION

In an embodiment, the invention is discloses a chemical mechanical planarization composition comprising:
a) an abrasive;
b) at least three surfactants; and
c) an oxidizing agent.
In another embodiment, the invention discloses a method for chemical mechanical planarization of a surface having at least one feature thereon comprising copper, said method comprising the steps of:
A) placing a substrate having the surface having the at least one feature thereon comprising copper in contact with a polishing pad;
B) delivering a polishing composition comprising:
a) an abrasive;
b) at least three surfactants; and
c) an oxidizing agent; and
C) polishing the substrate with the composition.
The at least three surfactants are preferably non-ionic. An example of one of the three surfactants is nonylphenol novolac ethoxylate in the range of 100 ppm to 2000 ppm.

DETAILED DESCRIPTION OF THE INVENTION

This invention is a method using associated polishing compositions (slurries) for polishing a copper-containing substrate. Such compositions have been surprisingly and unexpectedly found to afford high removal rates for copper during copper CMP processing while also affording low levels of dishing during the course of copper CMP. The prevention of dishing/erosion of features on semiconductor substrates during CMP processing is becoming increasingly more important as the semiconductor industry trends to smaller and smaller feature sizes in the manufacture of integrated circuits.

The slurry compositions and associated methods of this invention can have pH values that range from about 4 to about 7.5, such as from about 4 to about 7.3. In an embodiment, the pH ranges from about 4 to about 7.1; in another embodiment, the pH ranges from about 5 to about 7.1. In yet another embodiment, the pH ranges from about 6.5 to about 7.5. In most applications of this invention, a pH value near 7 (neutral) is preferred.

The slurry compositions and associated methods of this invention are comprised of three or more surfactants (also termed surface wetting agents) that act synergistically to afford high copper removal rates and low dishing values during the course of copper CMP processing. The choice of surfactants can include non-ionic surfactants, cationic surfactants, anionic surfactants, zwitterionic surfactants, and any combinations thereof. Non-ionic surfactants are preferred.

In an embodiment, the at least three surfactants are non-ionic surfactants. In an embodiment, the at least three surfactants are three different surfactants. In an embodiment, the three different surfactants are MERPOL SH (ethylene oxide condensate), TWEEN 20 (polyoxyethylene(20)monolaurate), and DISPERS (nonylphenol novolac ethoxylate). In an embodiment, the three different surfactants are GAE4TPBE, DISPERS, and SALIC-OX. In an embodiment, the three different surfactants are SALIC-OX, TWEEN 20, and DIS- PERS. In an embodiment, the three different surfactants are GAELE, DISPERS, and SALIC-OX. In an embodiment, the three different surfactants are GLY GLYC, DISPERS, and SALIC-OX. In an embodiment, the at least three different surfactants are selected from the group consisting of GAE4TPBE, GAELE, GLY GLYC, and SALIC-OX.

In this invention, DISPERS is a preferred surfactant to be one of the at least three sufactants present and to be present in the polishing compositions at the highest level (compared to levels present for the two or more other surfactants). Surprisingly, DISPERS has been found to be a surfactant that is effective in reducing dishing and yet one that does not (undesirably) reduce the removal rate of copper during CMP processing. DISPERS can effectively be used as the major surfactant component present in the at least three surfactants at levels ranging from 100 ppm to 2000 ppm in an embodiment, at levels ranging from 500 ppm to 1500 ppm in another embodiment, and levels ranging from 700 ppm to 1400 ppm in yet another embodiment.

Suitable abrasives for this invention include, but are not limited to, alumina, ceria, Germania, silica, titania, zirconia, and mixtures thereof. In one embodiment, the abrasive is silica (colloidal silica or fumed silica). In an embodiment, the abrasive is colloidal silica. The abrasive level in the slurry can broadly range from about 10 ppm to about 25 weight % of the total weight of the slurry. In a preferrred embodiment, the abrasive level is relatively low and ranges from about 10 ppm to about 2 weight percent. In an embodiment, the abrasive level is about 10 ppm to about 1 weight percent; in another embodiment, the abrasive level ranges from about 25 ppm to about 100 ppm. In an alternative embodiment a preferred amount of abrasive is between 25 ppm and 300 ppm.

The oxidizing agent can be any suitable oxidizing agent. Suitable oxidizing agents include, for example, one or more per-compounds, which comprise at least one peroxy group (—O—O—). Suitable per-compounds include, for example, peroxides, persulfates (e.g., monopersulfates and dipersulfates), percarbonates, and acids thereof, and salts thereof, and mixtures thereof. Other suitable oxidizing agents include, for example, oxidized halides (e.g., chlorates, bromates, iodates, perchlorates, perbromates, periodates, and acids thereof, and mixtures thereof, and the like), perboric acid, perborates, percarbonates, peroxyacids (e.g., peracetic acid, perbenzoic acid, m-chloroperbenzoic acid, salts thereof, mixtures thereof, and the like), permanganates, chromates, cerium compounds, ferricyanides (e.g., potassium ferricyanide), mixtures thereof, and the like. Some specific oxidizers that are useful in this invention include, but are not limited to, hydrogen peroxide, periodic acid, potassium iodate, potassium permanganate, ammonium persulfate, ammonium molybdate, ferric nitrate, nitric acid, potassium nitrate, ammonia, and other amine compounds, and mixtures thereof. Preferred oxidizing agents include, for example, hydrogen peroxide and urea-hydrogen peroxide.

In this invention, (hydrogen peroxide) $H_2O_2$ is used as a preferred oxidizing agent. When used, the concentration of the $H_2O_2$ is from about 0.2 weight % to about 5 weight % of the total weight of the slurry in an embodiment. In another embodiment, the concentration of the $H_2O_2$ is from about 0.5 weight % to about 2 weight % of the total weight of the slurry. In another embodiment, the concentration of the $H_2O_2$ is from about 0.5 weight % to about 1.5 weight %.

A pH-adjusting agent may be a component in the slurry. The pH-adjusting agent is used to improve the stability of the polishing composition, to improve the safety in handling and use, or to meet the requirements of various regulations. Suitable pH-adjusting agents to lower the pH of the polishing composition of the present invention include, but are not limited to, hydrochloric acid, nitric acid, sulfuric acid, chloroacetic acid, tartaric acid, succinic acid, citric acid, malic acid, malonic acid, various fatty acids, various polycarboxylic acids and mixtures thereof. Suitable pH-adjusting agents to raise the pH of the polishing composition of the present invention include, but are not limited to, potassium hydroxide, sodium hydroxide, ammonia, tetramethylammonium hydroxide, ethylenediamine, piperazine, polyethyleneimine, modified polyethyleneimines, and mixtures thereof.

Suitable acid compounds that may be added to the slurry composition include, but are not limited to, formic acid, acetic acid, propanoic acid, butanoic acid, pentanoic acid, hexanoic acid, heptanoic acid, octanoic acid, nonanoic acid, lactic acid, hydrochloric acid, nitric acid, phosphoric acid, sulfuric acid, hydrofluoric acid, malic acid, tartaric acid, gluconic acid, citric acid, phthalic acid, pyrocatechoic acid, pyrogallol carboxylic acid, gallic acid, tannic acid, and mixtures thereof. These acid compounds may be present in the slurry composition in a concentration of about 0 weight % to about 1 weight % of the total weight of the slurry.

Still other chemicals that can be added to the slurry compositions are biological agents such as bactericides, biocides and fungicides especially if the pH is around about 6 to 9. Suitable biocides, include, but are not limited to, 1,2-benzisothiazolin-3-one; 2(hydroxymethyl)amino ethanol; 1,3-dihydroxymethyl-5,5-dimethylhydantoin; 1-hydroxymethyl-5,5-dimethylhydantion; 3-iodo-2-propynyl butylcarbamate; glutaraldehyde; 1,2-dibromo-2,4-dicyanobutane; 5-chloro-2-methyl-4-isothiazoline-3-one; 2-methyl-4-isothiazolin-3-one; and mixtures thereof.

Associated Method

The method of this invention entails use of the aforementioned composition (as disclosed supra) for chemical mechanical planarization of substrates comprised of metals and dielectric materials. In the methods, a substrate (e.g., a wafer) is placed face-down on a polishing pad which is fixedly attached to a rotatable platen of a CMP polisher. In this manner, the substrate to be polished and planarized is placed in direct contact with the polishing pad. A wafer carrier system or polishing head is used to hold the substrate in place and to apply a downward pressure against the backside of the substrate during CMP processing while the platen and the substrate are rotated. The polishing composition (slurry) is applied (usually continuously) on the pad during CMP processing to effect the removal of material to planarize the substrate.

The method of this invention using the associated polishing composition (slurry) is effective for CMP of a wide variety of substrates, including substrates having dielectric portions that comprise materials having dielectric constants less than 3.3 (low-k materials). Suitable low-k films in substrates include, but are not limited to, organic polymers, carbon-doped oxides, fluorinated silicon glass (FSG), inorganic porous oxide-like materials, and hybrid organic-inorganic materials. Representative low-k materials and deposition methods for these materials are summarized below.

| Vendor | Trade Name | Deposition Method | Material |
|---|---|---|---|
| Air Products and Chemicals | MesoElk ® | Spin-on | Hybrid organic-inorganic |

| Vendor | Trade Name | Deposition Method | Material |
|---|---|---|---|
| Applied Materials | Black Diamond | CVD | Carbon-doped oxide |
| Dow Chemical | SiLK ™, Porous SiLK ™ | Spin-on | Organic polymer |
| Honeywell Electronic Materials | NANOGLASS ® E | Spin-on | Inorganic oxide-like |
| Novellus Systems | CORAL ® | PECVD | Carbon-doped oxide |

PECVD = Plasma enhanced chemical vapor deposition
CVD = chemical vapor deposition Current copper CMP technology uses a two-step process to achieve local and global planarization in the production of IC chips. During copper CMP in step 1, the overburden copper is removed during IC fabrication processing. After removing the overburden copper in step 1, the polished surface still has not achieved local and global planarity due to differences in the step heights between high density and low density features on pattern wafers. After removing the overburden copper in step 1, a high tantalum to copper selectivity is desired to achieve local and global planarization. A challenging task is to maintain high tantalum removal while achieving high tantalum to copper selectivity and protection of the low lying copper regions. If the low lying copper regions are not protected during polishing, this results in a defect commonly known as "dishing". A slurry which can increase the tantalum to copper selectivity during polishing in step 2 can reduce "dishing" by providing wide overpolish window during chip fabrication processing.

| GLOSSARY | |
|---|---|
| SURFACTANTS* | |
| TWEEN 20 | polyoxyethylene(20)monolaurate (Aldrich Chem. Co., Milwaukee, WI) |
| MERPOL SH | ethylene oxide condensate (Aldrich Chem. Co., Milwaukee, WI) |
| SALIC-OX | Salicyldoxime (Aldrich Chem. Co., Milwaukee, WI) |
| GAE4TPBE | Glycolic acid ethoxylate-4-tert-butylphenyl ether (Aldrich Chem. Co., Milwaukee, WI) |
| GAELE | Glycolic acid ethoxylate lauryl ether (Aldrich Chem. Co., Milwaukee, WI) |
| GLY GLYC | Glycyl glycine (Aldrich Chem. Co., Milwaukee, WI) |
| DISPERS | DISPERSOGEN ® 2774, nonylphenol novolac ethoxylate (Clariant, Germany) |
| OTHER COMPONENTS | |
| Colloidal silica | Polyedge 2002 (W. R. Grace & Co., Baltimore, MD) |
| Glycine | Chattem Chemicals, Inc, 3708 St. Elmo Avenue, Chattanooga, TN, 37409 |
| 1,2,4-Triazole | Arkema, Basic Chemicals, 2000 Market streert, , Philadelphia, PA, 19103 |
| PETEOS | Plasma enhanced deposition of tetraethoxy silane, dielectric oxide layer. |
| Polishing Pad | Polishing pad, Politex ®, and IC1000 were used during CMP, supplied by Rodel, Inc, Phoenix, AZ. |
| TEOS | Tetraethyl orthosilicate |

*All of the above surfactants are nonionic surfactants.

Parameters
  General
Å: angstrom(s)—a unit of length
BP: back pressure, in psi units
CMP: chemical mechanical planarization=chemical mechanical polishing
CS: carrier speed
DF: Down force: pressure applied during CMP, units psi
min: minute(s)
ml: milliliter(s)
mV: millivolt(s)
psi: pounds per square inch
PS: platen rotational speed of polishing tool, in rpm (revolution(s) per minute)
SF: slurry flow, ml/min
  Removal Rates and Selectivities
Cu RR 3.0 psi Measured copper removal rate at 3.0 psi down force (DF) of the CMP tool
Cu RR 1.5 psi Measured copper removal rate at 1.5 psi down force (DF) of the CMP tool The present invention is further demonstrated by the examples below.

EXAMPLES

General

All percentages are weight percentages unless otherwise indicated.

CMP Methodology

In the examples presented below, CMP experiments were run using the procedures and experimental conditions given below.

Metrology

PETEOS thickness was measured with an oxide thickness measuring instrument, Nanometrics, model, #9200, manufactured by Nanometrics Inc, Buckeye, Milpitas, Calif. 95035-7418. The metal films were measured with a metal thickness measuring instrument, ResMap CDE, model 168, manufactured by Creative Design Engineering, Inc, 20565 Alves Dr, Cupertino, Calif., 95014. The ResMap tool is a four-point probe sheet resistance tool. Twenty-five and forty nine-point polar scans were taken with the respective tools at 3-mm edge exclusion.

CMP Tool

The CMP tool that was used is a Mirra®, manufactured by Applied Materials, 3050 Bowers Avenue, Santa Clara, Calif., 95054. A Rodel Politex® embossed pad, supplied by Rodel, Inc, 3804 East Watkins Street, Phoenix, Ariz., 85034, was used on the platen for the blanket wafer polishing studies. Pads were broken-in by polishing twenty-five dummy oxide (deposited by plasma enhanced CVD from a TEOS precursor, PETEOS) wafers. In order to qualify the tool settings and the pad break-in, two PETEOS monitors were polished with Syton® OX-K colloidal silica, supplied by DuPont Air Products NanoMaterials L.L.C., at baseline conditions.

In blanket wafers studies, groupings were made to simulate successive film removal: first copper, next tantalum, and finally the PETEOS. The tool mid-point conditions were: table speed; 123 rpm, head speed; 112 rpm, membrane pressure, 2.0 psi; inter-tube pressure, 0.0 psi; slurry flow, 200 ml/min.

Wafers

Polishing experiments were conducted using electrochemically deposited copper, tantalum, and PETEOS wafers. These blanket wafers were purchased from Silicon Valley Microelectronics, 1150 Campbell Ave, CA, 95126. The film thickness specifications are summarized below:

PETEOS: 15,000 Å on silicon
Copper: 10,000 Å electroplated copper/1,000 Å copper seed/250 Å Ta on silica

Dishing Measurements

Dishing measurements were made using a KLA Tencor P15 Profilometer as the basic tool. The wafers used were the following: Cu/TEOS MIT 854 pattern, 200 mm in Diameter. Measurement sites were the following: 100 micron, 50 micron, and 10 micron lines across the wafer (Center, Middle and Edge, respectively) starting at 5 mm edge exclusion. (The way the P-15 measures dishing is through a contact stylus profiler. A diamond tip flows in contact with the surface following it's morphology. A position transducer convert tip movements into height values producing the surface profile.)

Example 1

Comparative

A standard reference copper CMP slurry was made up having the following composition:

| Component | Weight Percentage |
| --- | --- |
| Colloidal silica | <0.5 |
| Glycine | 0.63 |
| Triazole | 0.03 |
| Hydrogen Peroxide | 1.0 |
| Biocide | (ppm level) |

The pH of this standard reference copper CMP slurry was adjusted to 7.0.

Polishing experiments using this standard reference slurry were conducted at 1.5 psi and 3.0 psi down force (DF) and afforded the results reported in Table 1 for copper removal rates and dishing values.

Example 2

A slurry was made up for this example by adding three selected surface wetting agents to the standard slurry of Example 1 (prior to addition of oxidizing agent). For this example, the three selected surface wetting agents were MERPOL SH, TWEEN 20, and DISPERS, which were added at levels of 10 ppm, 20 ppm, and 700 ppm, respectively. Polishing experiments using this slurry were conducted at 1.5 psi and 3.0 psi down force (DF) and afforded the results reported in Table 1 for copper removal rates and dishing values. As indicated by the polishing data in Table 1, dishing of the polished copper surface using this inventive slurry was improved by 67% compared to dishing for the polished copper surface using the standard reference copper CMP slurry.

Example 3

Comparative

A slurry was made up using 700 ppm of DISPERS surface wetting agent. The polishing conditions were the same as those used for Example 2. The average dishing for the polishing copper surface on 100×100 micron line was 648 Å which represented about 36.7% improvement in dishing than the dishing value obtained when using the standard reference slurry of Example 1. After using the combination of three selected surface wetting agents in Example 2, the dishing being improved by about 67% which represented almost 30% more improvement in controlling dishing than using only a single surface wetting agent.

Example 4

Comparative

A slurry was made up using 700 ppm DISPERS and 20 ppm Tween 20. The polishing conditions were the same as those used for Example 2. The average dishing for the polishing copper surface on 100×100 micron line was 457 Å, which represented about a 55.3% improvement in dishing than the dishing value obtained when using the standard reference slurry of Example 1 respectively. After using the combination of three selected surface wetting agents in Example 2, the dishing being improved by about 67% which represented almost 12% more improvement in controlling dishing than using the combination of two surface wetting agents as in Example 4.

Example 5

Comparative

A slurry was made up using 700 ppm DISPERS and 25 ppm MERPOL SH. The polishing conditions were the same as those used for Example 2. The average dishing for the polishing copper surface on 100×100 micron line was 554 Å, which represented a 45.8% improvement in dishing than the dishing value obtained when using the standard reference slurry of Example 1. After using the combination of three selected surface wetting agents in Example 2, the dishing being improved by about 67% which represented almost 21% more improvement in controlling dishing than using the combination of two surface wetting agents as in this Example (5).

Example 6

A slurry was made up for this example by adding three selected surface wetting agents to the standard slurry of Example 1 (prior to addition of oxidizing agent). For this example, the three selected surface wetting agents were GAE4TPBE, DISPERS, and SALIC-OX, which were added at levels of 10 ppm, 1400 ppm, and 20 ppm, respectively. Polishing experiments using this slurry were conducted at 1.5 psi and 3.0 psi down force (DF) and afforded the results reported in Table 1 for copper removal rates and dishing values. As indicated by the polishing data in Table 1, dishing of the polished copper surface using this inventive slurry was improved by 60% compared to dishing for the polished copper surface using the standard reference copper CMP slurry.

Example 7

Comparative

A slurry was also made up only using 1400 ppm of DISPERS surface wetting agent. The polishing conditions were the same as those used for Example 6. The average dishing for the polishing copper surface on 100×100 micron line was 614 Å, which represented about a 40% improvement in dishing compared to the dishing value obtained when using the standard reference slurry of Example 1. After using the combination of three selected surface wetting agents in Example 6, the dishing being improved by about 60% which represented 20% more improvement in controlling dishing than using only a single surface wetting agent.

Example 8

Comparative

Another slurry using a two surface wetting agent combination (1400 ppm DISPERS+20 ppm SALIC-OX), was also made up and tested. The polishing conditions were the same as those used for Example 6. The average dishing for the polishing copper surface on 100×100 micron line was 576 Å, which represented about 43.7% improvement in dishing than the dishing value obtained when using the standard reference slurry of Example 1. After using the combination of three selected surface wetting agents in Example 6, the dishing being improved by about 60% which represented almost 16.3% more improvement in controlling dishing than using the combinations of two surface wetting agents as in this Example 8.

Example 9

A slurry was made up for this example by adding three selected surface wetting agents to the standard slurry of Example 1 (prior to addition of oxidizing agent). For this example, the three selected surface wetting agents were SALIC-OX, TWEEN 20, and DISPERS, which were added at levels of 10 ppm, 25 ppm, and 1500 ppm, respectively. Polishing experiments using this slurry were conducted at 1.5 psi and 3.0 psi down force (DF) and afforded the results reported in Table 1 for copper removal rates and dishing values. As indicated by the polishing data in Table 1, dishing of the polished copper surface using this inventive slurry was improved by 54% compared to dishing for the polished copper surface using the standard reference copper CMP slurry.

Example 10

Comparative

A slurry was also made up using 1500 ppm of DISPERS surface wetting agent. The polishing conditions were the same as those used for Example 9. The average dishing for the polishing copper surface on 100×100 micron line was 644 Å, which represented about 37% improvement in dishing than the dishing value obtained when using the standard reference slurry of Example 1. After using the combination of three selected surface wetting agents in Example 9, the dishing being improved by about 54% which represented 17% more improvement in controlling dishing than using only a single surface wetting agent as in this Example 10.

Example 11

Comparative

Another slurry using a two surface wetting agent combination (1500 ppm DISPERS+25 ppm TWEEN 20) was also made up and tested. The polishing conditions were the same as those used for Example 9. The average dishing for the polishing copper surface on 100×100 micron line was 553 Å, which represented about 46% improvement in dishing than the dishing value obtained when using the standard reference slurry of Example 1. After using the combination of three selected surface wetting agents in Example 9, the dishing being improved by about 60% which represented almost 8% more improvement in controlling dishing than using the combinations of two surface wetting agents as in this Example 11.

Example 12

A slurry was made up for this example by adding three selected surface wetting agents to the standard slurry of Example 1 (prior to addition of oxidizing agent). For this example, the three selected surface wetting agents were GAELE, DISPERS, and SALIC-OX which were added at levels of 5 ppm, 1400 ppm, and 20 ppm, respectively. Polishing experiments using this slurry were conducted at 1.5 psi and 3.0 psi down force (DF) and afforded the results reported in Table 1 for copper removal rates and dishing values. As indicated by the polishing data in Table 1, dishing of the polished copper surface using this inventive slurry was improved by 68% compared to dishing for the polished copper surface using the standard reference copper CMP slurry.

Example 13

Comparative

A slurry was made up using 1400 ppm of DISPERS surface wetting agent. The polishing conditions were the same as those used for Example 12.

The average dishing for the polished copper surface on 100×100 micron line was 614 Å, which represented about 40% improvement in dishing compared to the dishing value obtained when using the standard reference slurry of Example 1. After using the combination of three selected surface wetting agents in Example 12, the dishing being improved by about 68% which represented a 28% higher improvement in controlling dishing than using only a single surface wetting agent as in this Example 13.

Example 14

Comparative

Another slurry having a two surface wetting agent combination (1400 ppm DISPERS+20 ppm SALIC-OX) was made up and tested. The polishing conditions were the same as those used for Example 12. The average dishing for the polishing copper surface on 100×100 micron line was 576 Å, which represented about 43.7% improvement in dishing compared to the dishing value obtained when using the standard reference slurry of Example 1. After using the combination of three selected surface wetting agents in Example 12, the dishing being improved by about 68% which represented almost 24.3% higher improvement in controlling dishing than using the combinations of two surface wetting agents as in this Example 14.

Example 15

A slurry was made up for this example by adding three selected surface wetting agents to the standard slurry of Example 1 (prior to addition of oxidizing agent). For this example, the three selected surface wetting agents were GLY GLYC, DISPERS, and SALIC-OX, which were added at levels of 250 ppm, 700 ppm, and 10 ppm, respectively. Polishing experiments using this slurry were conducted at 1.5 psi and 3.0 psi down force (DF) and afforded the results reported in Table 1 for copper removal rates and dishing values. As indicated by the polishing data in Table 1, dishing of the polished copper surface using this inventive slurry was improved by 61% compared to dishing for the polished copper surface using the standard reference copper CMP slurry.

Example 16

Comparative

A slurry was also made up using 700 ppm of DISPERS surface wetting agent. The polishing conditions were the same as those used for Example 15

The average dishing for the polishing copper surface on 100×100 micron line was 648 Å, which represented about a 36.7% improvement in dishing compared to the dishing value obtained when using the standard reference slurry of Example 1. After using the combination of three selected surface wetting agents in Example 15, the dishing being improved by about 61% which represented almost 24.3% more improvement in controlling dishing than using only a single surface wetting agent as in this Example 16.

Example 17

Comparative

Another slurry having a two surface wetting agent combination (700 ppm DISPERS+20 ppm SALIC-OX), was made up and tested. The polishing conditions were the same as those used for Example 15. The average dishing for the polishing copper surface on 100×100 micron line was 489 Å, which represented about 52.2% improvement in dishing in comparison to the dishing value obtained when using the standard reference slurry of Example 1. After using the combination of three selected surface wetting agents in Example 15, the dishing being improved by about 61% which represented almost 9% more improvement in controlling dishing than using the combinations of two surface wetting agents as in this Example 17

Summary of Results for Examples 1-17

As the results demonstrate in all above mentioned examples (all examples and data listed in Table 1), using a slurry having the inventive three surface wetting agent combination approach, dishing on the polished copper wafers was reduced more than using either using a slurry having a single surface wetting agent or a slurry having a combination of two surface wetting agents. This invention provides a very useful methodology on improving dishing control when using copper CMP slurries to polish copper wafer surfaces.

TABLE 1

| CMP Slurry[b] | Cu RR 3.0 psi (Å/min.) | Cu RR 1.5 psi (Å/min.) | Dishing in Å. 100 μm line (average of C, M & E)[a] |
|---|---|---|---|
| Example 1 Slurry (Comparative) Standard Cu Slurry | 7032 | 2231 | 1023 |
| Example 2 Slurry | 7263 | 1809 | 341 |
| Example 3 Slurry (Comparative) | 6454 | 2536 | 648 |
| Example 4 Slurry (Comparative) | 7990 | 2043 | 457 |
| Example 5 Slurry (Comparative) | 6820 | 2557 | 554 |
| Example 6 Slurry | 8560 | 1947 | 410 |
| Example 7 Slurry (Comparative) | 9770 | 2766 | 614 |
| Example 8 Slurry (Comparative) | 8890 | 1868 | 576 |
| Example 9 Slurry | 10946 | 2032 | 467 |
| Example 10 Slurry (Comparative) | 9776 | 2338 | 644 |
| Example 11 Slurry (Comparative) | 8163 | 2445 | 553 |
| Example 12 Slurry | 6360 | 1890 | 330 |
| Example 13 Slurry (Comparative) | 9770 | 2766 | 614 |
| Example 14 Slurry (Comparative) | 8890 | 1868 | 576 |
| Example 15 Slurry | 8240 | 1849 | 396 |
| Example 16 Slurry (Comparative) | 6454 | 2536 | 648 |
| Example 17 Slurry (Comparative) | 8171 | 1852 | 489 |

[a]C = dishing at center of test wafer, M = dishing at middle of test wafer, and E = dishing at edge of test wafer.
[b]The pH of each of these slurries was approximately 7.

The invention claimed is:

1. A method for chemical mechanical planarization of a surface having at least one feature thereon comprising copper, said method comprising the steps of:
   A) placing a substrate having the surface having the at least one feature thereon comprising copper in contact with a polishing pad;
   B) delivering a polishing composition comprising:
      a) an abrasive;
      b) at least three surfactants; and
      c) an oxidizing agent;
      wherein one of the at least three surfactants is nonylphenol novolac ethoxylate presented at a level ranging from 100 ppm to 2000 ppm;
   and
   C) polishing the substrate with the composition.

2. The method of claim 1 wherein the at least three surfactants are nonionic surfactants.

3. The method of claim 1, wherein the three different surfactants are ethylene oxide condensate, polyoxyethylene monolaurate, and nonylphenol novolac ethoxylate.

4. The method of claim 1, wherein the three different surfactants are glycolic acid ethoxylate-4-tert-butylphenyl ether, nonylphenol novolac ethoxylate, and salicyldoxime.

5. The method of claim 1, wherein the three different surfactants are salicyldoxime, polyoxyethylene monolaurate, and nonylphenol novolac ethoxylate.

6. The method of claim 1, wherein the three different surfactants are glycolic acid ethoxylate lauryl ether, nonylphenol novolac ethoxylate, and salicyldoxime.

7. The method of claim 1, wherein the three different surfactants are glycyl glycine, nonylphenol novolac ethoxylate, and salicyldoxime.

8. The method of claim 1 wherein other two surfactants are selected from the group consisting of glycolic acid ethoxylate-4-tert-butylphenyl ether, glycolic acid ethoxylate lauryl ether, glycyl glycine, polyoxyethylene monolaurate and salicyldoxime.

9. A chemical mechanical planarization composition comprising:
   a) an abrasive;
   b) at least three surfactants; and
   c) an oxidizing agent;
   wherein one of the at least three surfactants is nonylphenol novolac ethoxylate presented at a level ranging from 100 ppm to 2000 ppm.

10. The chemical mechanical planarization composition of claim 9 wherein the at least three surfactants are nonionic surfactants.

11. The chemical mechanical planarization composition of claim 9, wherein other two surfactants are selected from the group consisting of glycolic acid ethoxylate-4-tert-butylphenyl ether, glycolic acid ethoxylate lauryl ether, glycyl glycine, polyoxyethylene monolaurate and salicyldoxime.

12. The chemical mechanical planarization composition of claim 9, wherein the at least three surfactants are ethylene oxide condensate, polyoxyethylene monolaurate, and nonylphenol novolac ethoxylate.

13. The chemical mechanical planarization composition of claim 9, wherein the at least three surfactants are glycolic acid ethoxylate-4-tert-butylphenyl ether, nonylphenol novolac ethoxylate, and salicyldoxime.

14. The chemical mechanical planarization composition of claim 9, wherein the at least three surfactants are salicyldoxime, polyoxyethylene monolaurate, and nonylphenol novolac ethoxylate.

15. The chemical mechanical planarization composition of claim 9, wherein the at least three surfactants are glycolic acid ethoxylate lauryl ether, nonylphenol novolac ethoxylate, and salicyldoxime.

16. A chemical mechanical planarization composition comprising:
   a) an abrasive;
   b) at least three nonionic surfactants; and
   c) an oxidizing agent
   wherein one of the at least three nonionic surfactants is nonylphenol novolac ethoxylate presented at a level ranging from 100 ppm to 2000 ppm.

17. The chemical mechanical planarization composition of claim 16, wherein other two surfactants are selected from the group consisting of glycolic acid ethoxylate-4-tert-butylphenyl ether, glycolic acid ethoxylate lauryl ether, glycyl glycine, polyoxyethylene monolaurate and salicyldoxime.

* * * * *